United States Patent
Yang et al.

(10) Patent No.: US 12,388,363 B2
(45) Date of Patent: Aug. 12, 2025

(54) POWER CONTROL CIRCUIT FOR VEHICLE AND OPERATING METHOD THEREOF

(71) Applicants: Hyundai Motor Company, Seoul (KR); Kia Corporation, Seoul (KR); Yura Corporation Co., Ltd., Gyeonggi-do (KR)

(72) Inventors: Hee Gun Yang, Gyeonggi-do (KR); Kang Woo Bae, Gyeonggi-do (KR); Sung In Baek, Gyeonggi-do (KR); Kyung Seok Lee, Gyeonggi-do (KR); Chan Young Jung, Gyeonggi-do (KR)

(73) Assignees: Hyundai Motor Company, Seoul (KR); Kia Corporation, Seoul (KR); Yura Corporation Co., Ltd., Seongnam (KR)

( * ) Notice: Subject to any disclaimer, the term of this patent is extended or adjusted under 35 U.S.C. 154(b) by 0 days.

(21) Appl. No.: 18/591,166

(22) Filed: Feb. 29, 2024

(65) Prior Publication Data
US 2025/0038659 A1    Jan. 30, 2025

(30) Foreign Application Priority Data
Jul. 25, 2023   (KR) .................. 10-2023-0096727

(51) Int. Cl.
| | |
|---|---|
| *H02M 3/07* | (2006.01) |
| *B60L 50/60* | (2019.01) |
| *H02M 1/088* | (2006.01) |
| *H02M 3/157* | (2006.01) |
| *H03K 17/30* | (2006.01) |

(52) U.S. Cl.
CPC ............ *H02M 3/07* (2013.01); *B60L 50/60* (2019.02); *H02M 1/088* (2013.01); *H02M 3/157* (2013.01); *H03K 17/30* (2013.01)

(58) Field of Classification Search
CPC ........ H02M 3/07; H02M 1/088; H02M 3/157; B60L 50/60; H03K 17/30
See application file for complete search history.

(56) References Cited

U.S. PATENT DOCUMENTS

| | | | |
|---|---|---|---|
| 2010/0182347 A1* | 7/2010 | Lin ................... | H05B 41/282 345/690 |
| 2013/0049665 A1* | 2/2013 | Oyobe ................. | H02P 3/22 318/489 |

(Continued)

*Primary Examiner* — Jared Fureman
*Assistant Examiner* — Esayas G Yeshaw
(74) *Attorney, Agent, or Firm* — Fox Rothschild LLP

(57) ABSTRACT

A power control circuit for a vehicle includes a power switch, N-type semiconductor switches electrically connected between a power supply terminal to which an input voltage is applied and the power switch and in which the N-type semiconductor switches are connected back-to-back, a charge pump circuit for generating a drive voltage to drive the N-type semiconductor switches by boosting the input voltage, a reverse voltage protection circuit electrically connected between an output terminal of the charge pump circuit and a node in which the N-type semiconductor switches are connected to each other, a microcontroller for generating a pulse width modulation signal for the operation of the charge pump circuit, and a voltage attenuation circuit for attenuating the drive voltage and applying the attenuated drive voltage to the microcontroller.

20 Claims, 5 Drawing Sheets

(56) References Cited

U.S. PATENT DOCUMENTS

| | | | |
|---|---|---|---|
| 2014/0071722 A1* | 3/2014 | Gao | H02M 7/2176 363/80 |
| 2023/0318594 A1* | 10/2023 | Zhang | H03K 17/127 361/86 |
| 2024/0030812 A1* | 1/2024 | D'Souza | H02M 1/08 |

* cited by examiner

POWER CONTROL CIRCUIT FOR VEHICLE AND OPERATING METHOD THEREOF

CROSS REFERENCE TO RELATED APPLICATION

This application claims under 35 U.S.C. § 119(a) the benefit of Korean Patent Application No. 10-2023-0096727, filed Jul. 25, 2023, the entire contents of which are incorporated by reference herein.

BACKGROUND

(a) Technical Field

This disclosure relates to a power control circuit for a vehicle and an operating method thereof.

(b) Description of the Related Art

Current vehicle power control circuits employ a pair of switches connected back-to-back. The switches can be N-type metal-oxide semiconductor (NMOS) transistors or P-type metal-oxide semiconductor (PMOS) transistors. Using NMOS transistors requires gate driver integrated circuits (ICs) for their operation, which increases the cost. On the other hand, PMOS transistors do not require separate gate driver ICs, but the cost of the devices is about 30% higher than NMOS transistors.

SUMMARY

This disclosure provides a power control circuit and an operating method thereof that utilize N-type transistors connected back-to-back without a separate gate driver IC.

According to an aspect of this disclosure, a power control circuit includes at least one power switch, N-type semiconductor switches electrically connected between a power supply terminal to which an input voltage is applied and the at least one power switch, wherein the N-type semiconductor switches are connected back-to-back, a charge pump circuit configured to generate a drive voltage for driving the N-type semiconductor switches by boosting the input voltage, a microcontroller configured to generate a pulse width modulation (PWM) signal for the operation of the charge pump circuit, and a voltage attenuation circuit configured to attenuate the drive voltage and apply the attenuated drive voltage to the microcontroller.

In addition, the power control circuit may include a reverse voltage protection circuit electrically connected between an output terminal of the charge pump circuit and a node in which the N-type semiconductor switches are connected to each other, According to another aspect of this disclosure, a method of operating a power control circuit including at least one power switch, N-type semiconductor switches electrically connected between a power supply terminal to which an input voltage is applied and the at least one power switch, wherein the N-type semiconductor switches being connected back-to-back, and a charge pump circuit configured to generate a drive voltage for driving the N-type semiconductor switches by boosting the input voltage is provided. The method includes generating, by a microcontroller, a pulse width modulation (PWM) signal for the operation of the charge pump circuit, measuring, by the microcontroller, the input voltage and the drive voltage, and determining, by the microcontroller, whether the charge pump circuit is faulty based on the measured input voltage and the measured drive voltage satisfying a predetermined first condition.

A vehicle may incorporate the power control circuit.

DETAILED DESCRIPTION

Figure 1:
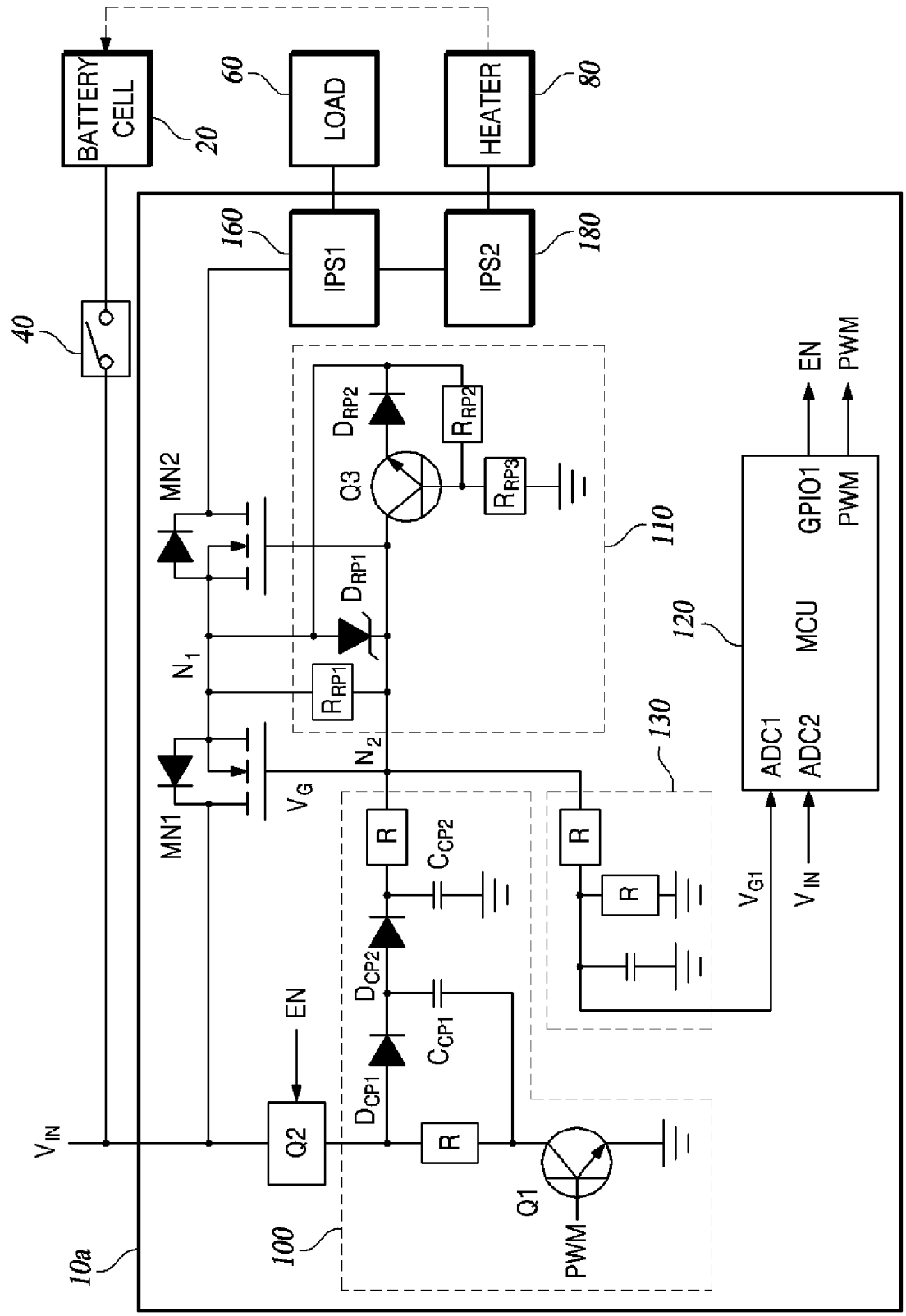
FIG. 1 is a circuit diagram illustrating a configuration of a power control circuit of a vehicle according to an embodiment of the present disclosure.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g. fuels derived from resources other than petroleum). As referred to herein, a hybrid vehicle is a vehicle that has two or more sources of power, for example both gasoline-powered and electric-powered vehicles.

The terminology used herein is for the purpose of describing particular embodiments only and is not intended to be limiting of the present disclosure. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Throughout the specification, unless explicitly described to the contrary, the word "comprise" and variations such as "comprises" or "comprising" will be understood to imply the inclusion of stated elements but not the exclusion of any other elements. In addition, the terms "unit", "-er", "-or", and "module" described in the specification mean units for processing at least one function and operation, and can be implemented by hardware components or software components and combinations thereof.

Further, the control logic of the present disclosure may be embodied as non-transitory computer readable media on a computer readable medium containing executable program instructions executed by a processor, controller or the like. Examples of computer readable media include, but are not limited to, ROM, RAM, compact disc (CD)-ROMS, magnetic tapes, floppy disks, flash drives, smart cards and optical data storage devices. The computer readable medium can also be distributed in network coupled computer systems so that the computer readable media is stored and executed in a distributed fashion, e.g., by a telematics server or a Controller Area Network (CAN).

Hereinafter descriptions are made of some embodiments of the present disclosure in detail with reference to accompanying drawings. It should be noted that while components may be presented on different drawings, an effort has been made to assign the same reference numerals to identical components whenever feasible. In the present disclosure, detailed descriptions of well-known functions and configurations may be omitted to avoid obscuring the subject matter of the disclosure.

When describing the components of embodiments in this disclosure, various ordinal terms such as "first," "second," "i)," "ii)," "a)," "b)," etc. can be used. These terms are merely used to distinguish one component from another, and the nature, sequence, or order of the corresponding components are not limited by the terms.

The description provided below, in conjunction with the accompanying drawings, is intended to offer exemplary embodiments of the disclosure, but not to limit the disclosure solely to those embodiments.

Figure 2:
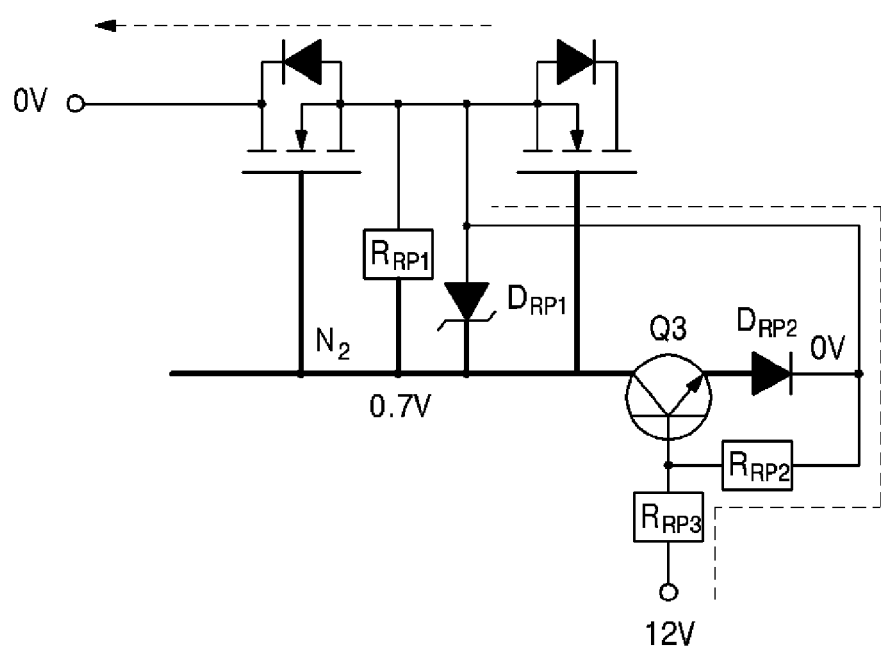
FIG. 2 is a circuit diagram illustrating the operation of a reverse voltage protection circuit according to one embodiment of the present disclosure.

FIG. 1 is a circuit diagram illustrating a configuration of a power control circuit of a vehicle according to an embodiment of the present disclosure. FIG. 2 is a circuit diagram illustrating the operation of a reverse voltage protection circuit according to one embodiment of the present disclosure.

The vehicle power control circuit 10a may include all or some of a pair of N-type semiconductor switches MN1 and MN2 connected back-to-back, a charge pump circuit 100, a reverse voltage protection circuit 110, a microcontroller 120, and at least one power switch 160 and 180. The blocks shown in FIG. 1 are exemplary components, and other embodiments may add, modify, or remove blocks as needed.

For example, the at least one power switch 160 and 180 may be an intelligent power switch (IPS), e.g., high-side or low-side switches that provide smart load management capabilities, and may be used to drive inductive, capacitive or resistive loads.

A pair of N-type semiconductor switches MN1 and MN2 may be electrically connected between a power supply terminal to which an input voltage $V_{IN}$ is applied and at least one power switch 160 and 180. A semiconductor switch is a semiconductor device that can be electrically controlled to turn on and off, such as a bipolar junction transistor (BJT), a metal-oxide-semiconductor field-effect transistor (MOSFET), a junction field-effect transistor (JFET), an insulated gate bipolar transistor (IGBT), a triode for alternating current (TRAC), a silicon-controlled rectifier (SCR), or a gate turn-off thyristor (GTO). In a preferred embodiment, the N-type semiconductor switches MN1 and MN2 may be n-channel MOSFET. The power supply terminal may be selectively connected to the battery cell 20. That is, the input voltage $V_{IN}$ may be supplied from the battery cell 20. A latch relay 40 may be provided between the power supply terminal and the battery cell 20.

The charge pump circuit 100 may boost the input voltage $V_{IN}$ to generate a drive voltage $V_G$ for driving the N-type semiconductor switches MN1 and MN2. The boost ratio of the charge pump circuit 100 may be set considering the magnitude of the input voltage $V_{IN}$ and the threshold voltage of the N-type semiconductor switches MN1 and MN2. For example, assuming that N-type semiconductor switches MN1 and MN2 is able to be stably operated when a voltage that is at least 10V higher than the source voltage is applied to the gate and an input voltage $V_{IN}$ of 12V, the boost ratio of the charge pump circuit 100 may be designed to be 2×.

The charge pump circuit 100 may include a plurality of diodes $D_{CP1}$ and $D_{CP2}$ connected in series and a plurality of capacitors $C_{CP1}$ and $C_{CP2}$ connected to the cathode of each diode $D_{CP1}$ and $D_{CP2}$. The number of diodes $D_{CP1}$ and $D_{CP2}$ and capacitors $C_{CP1}$ and $C_{CP2}$ may vary based on the boost ratio. That is, although the charge pump circuit 100 is shown with 2 diodes $D_{CP1}$ and $D_{CP2}$ and 2 capacitors $C_{CP1}$ and $C_{CP2}$ to double the input voltage $V_{IN}$ in FIG. 1, the circuit may include more diodes and capacitors.

The charge pump circuit 100 may perform boosting operation based on a pulse width modulation (PWM) signal. To this end, the charge pump circuit 100 may further include a first semiconductor switch Q1 that is connected between a terminal of at least one capacitor $C_{CP1}$ and the ground and selectively turned on by the PWM signal. One terminal of the capacitor $C_{CP1}$ may correspond to a terminal that is not connected to any of the diodes $D_{CP1}$ and $D_{CP2}$. The first semiconductor switch Q1 may be an NPN transistor. The PWM signal may be supplied from the microcontroller 120.

The vehicle power control circuit 10a may further include a second semiconductor switch Q2 connected between the charge pump circuit 100 and the power supply terminal. The second semiconductor switch Q2 may be an NPN transistor or a PNP transistor, but not limited thereto. The second semiconductor switch Q2 may be selectively turned on based on an enable (EN) signal. The EN signal may be supplied from the microcontroller 120.

As the second semiconductor switch Q2 turns on, the input voltage $V_{IN}$ may be supplied to the charge pump circuit 100. A leakage current in the vehicle power control circuit 10a may be reduce by turning off the second semiconductor switch Q2 during time intervals when the boost operation is not performed in the charge pump circuit 100.

The reverse voltage protection circuit 110 may detect reverse voltage across the power supply terminal and the ground, leading to turning off the N-type semiconductor switches MN1 and MN2. The reverse voltage protection circuit 110 may be electrically connected between the first node $N_1$ in which the N-type semiconductor switches MN1 and MN2 are connected and the second node $N_2$ in which electrically connected to the output terminal of the charge pump circuit 100 where the drive voltage $V_G$ is generated.

The reverse voltage protection circuit 110 may include a plurality of resistors $R_{RP1}$ to $R_{RP3}$, a plurality of diodes $D_{RP1}$ to $D_{RP2}$, and a third semiconductor switch Q3. The first resistor $R_{RP1}$ and the first diode $D_{RP1}$ may be connected between the first node $N_1$ and the second node $N_2$, respectively. That is, the first resistor $R_{RP1}$ and the first diode $D_{RP1}$ may be connected in parallel. The third semiconductor switch Q3 may have a first terminal connected to the second node $N_2$, a second terminal connected to the third resistor $R_{RP2}$, and a third terminal connected to the second diode $D_{RP2}$. The third semiconductor switch Q3 may be an NPN transistor. Here, the first, second, and third terminals may correspond to the collector, base, and emitter terminals, respectively. The second resistor $R_{RP2}$ may be connected between the second terminal of the third semiconductor switch Q3 and the first node $N_1$. The third resistor $R_{RP3}$ may be connected between the second terminal of the third semiconductor switch Q3 and the ground. The second diode $D_{RP2}$ may be connected between the third terminal of the third semiconductor switch Q3 and the first node $N_1$. For example, the anode of the second diode $D_{RP2}$ may be connected to the third semiconductor switch Q3, and the cathode may be connected to the first node $N_1$.

With reference to FIG. 2, when a reverse voltage is applied between the power supply terminal and the ground terminal (e.g., 12V applied to the ground terminal and 0V applied to the power supply terminal), a current path is formed through the third resistor $R_{RP3}$, second resistor $R_{RP2}$, and the first N-type semiconductor switch MN1, resulting in the voltage of the first node $N_1$ of the N-type semiconductor switches MN1 and MN2, i.e., the cathode voltage of the second diode $D_{RP2}$, becoming 0V. Furthermore, the third semiconductor switch Q3 is turned on by the input voltage $V_{IN}$ applied to the ground terminal, causing a voltage of 0.7V, corresponding to a voltage that is higher by the threshold voltage of the second diode $D_{RP2}$ than the ground voltage (i.e., 0V), is formed at the second node $N_2$. That is, when a reverse voltage is detected, the drive voltage $V_G$ applied to the gates of the N-type semiconductor switches MN1 and MN2 drops from 24V to 0.7V, causing the N-type semiconductor switches MN1 and MN2 to turn off.

The microcontroller 120 may generate PWM and EN signals to the first semiconductor switch Q1 and the second semiconductor switch Q2, respectively, for the operation of the charge pump circuit 100. The microcontroller 120 may also be referred to as a microcomputer, microprocessor computer, or microcontroller unit (MCU).

The microcontroller 120 may include one or more analog-digital converters (ADCs) to monitor one or more analog signals.

The microcontroller 120 may monitor the drive voltage $V_G$ to verify the stable operation of the N-type semiconductor switches MN1 and MN2. The microcontroller 120 may measure the drive voltage $V_G$ to determine the status of the charge pump circuit 100 for any malfunctions. The microcontroller 120 may determine the status of the charge pump circuit 100 for any malfunctions by verifying whether the drive voltage $V_G$ has a value within a preset range. For example, assuming an input voltage $V_{IN}$ of 12V and a boost factor of 2, the drive voltage $V_G$ should ideally be 24V. Taking a ±5% margin into account, the microcontroller 120 may determine that the charge pump circuit 100 is operating normally when the drive voltage $V_G$ is within the range of 22.8V to 25.8V, and consider it faulty when the drive voltage $V_G$ is out of the range.

The microcontroller 120 may also measure the input voltage $V_{IN}$ additionally. The microcontroller 120 may also determine the operating status of the charge pump circuit 100 by comparing the magnitudes of the input voltage $V_{IN}$ and the drive voltage $V_G$. For example, the microcontroller 120 may determine that the charge pump circuit 100 is faulty when the difference between the measured drive voltage $V_G$ and the product of the measured input voltage $V_{IN}$ and the boost factor of the charge pump circuit 100 is equal to or greater than a predetermined first threshold value. The first threshold value may be set, considering the +5% margin.

when the drive voltage $V_G$ does not meet the above conditions even though the microcontroller 120 has provided PWM and EN signals to the first semiconductor switch Q1 and the second semiconductor switch Q2, the microcontroller 120 may determine that the charge pump circuit 100 is faulty.

When the charge pump circuit 100 is determined to be faulty, the microcontroller 120 may cease the control of the N-type semiconductor switches MN1 and MN2. For example, the microcontroller 120 may stop the generation of the PWM and EN signals.

A voltage attenuation circuit 130 may be provided between the output terminal (I e. the second node $N_2$) of the charge pump circuit 100 and the microcontroller 120 to attenuate the drive voltage $V_G$ within the range of the maximum voltage convertible by the analog-to-digital converter when the drive voltage $V_G$ exceeds the maximum voltage that the analog-to-digital converter can handle. The voltage attenuation circuit 130 may include a plurality of resistors to attenuate the drive voltage $V_G$. Meanwhile, although the voltage attenuation circuit 130 is provided solely for the drive voltage $V_G$ in FIG. 1, it is also possible for another voltage attenuation circuit to be provided for the input voltage $V_{IN}$ depending on its magnitude and/or the specifications of the analog-to-digital converter.

Although it is exemplified that the microcontroller 120 includes an integrated analog-to-digital converter for measuring the drive voltage $V_G$ and input voltage $V_{IN}$ in FIG. 1, but this disclosure is not limited to this configuration. In an alternative embodiment, a separate analog-to-digital converter may also be provided. In this case, the microcontroller 120 may receive digital signals corresponding to the magnitudes of the drive voltage $V_G$ and input voltage $V_{IN}$ through one or more general-purpose input/output (GPIO) ports.

The first power switch 160 may selectively supply the input voltage $V_{IN}$ to the load 60 of the vehicle. The second power switch 180 may be configured to selectively supply the input voltage $V_{IN}$ to the heater 80 that regulates the temperature of the battery cell 20. As the heater 80 is operated by the second power switch 180, the low-temperature performance of the battery cell 20 can be improved.

Figure 3:
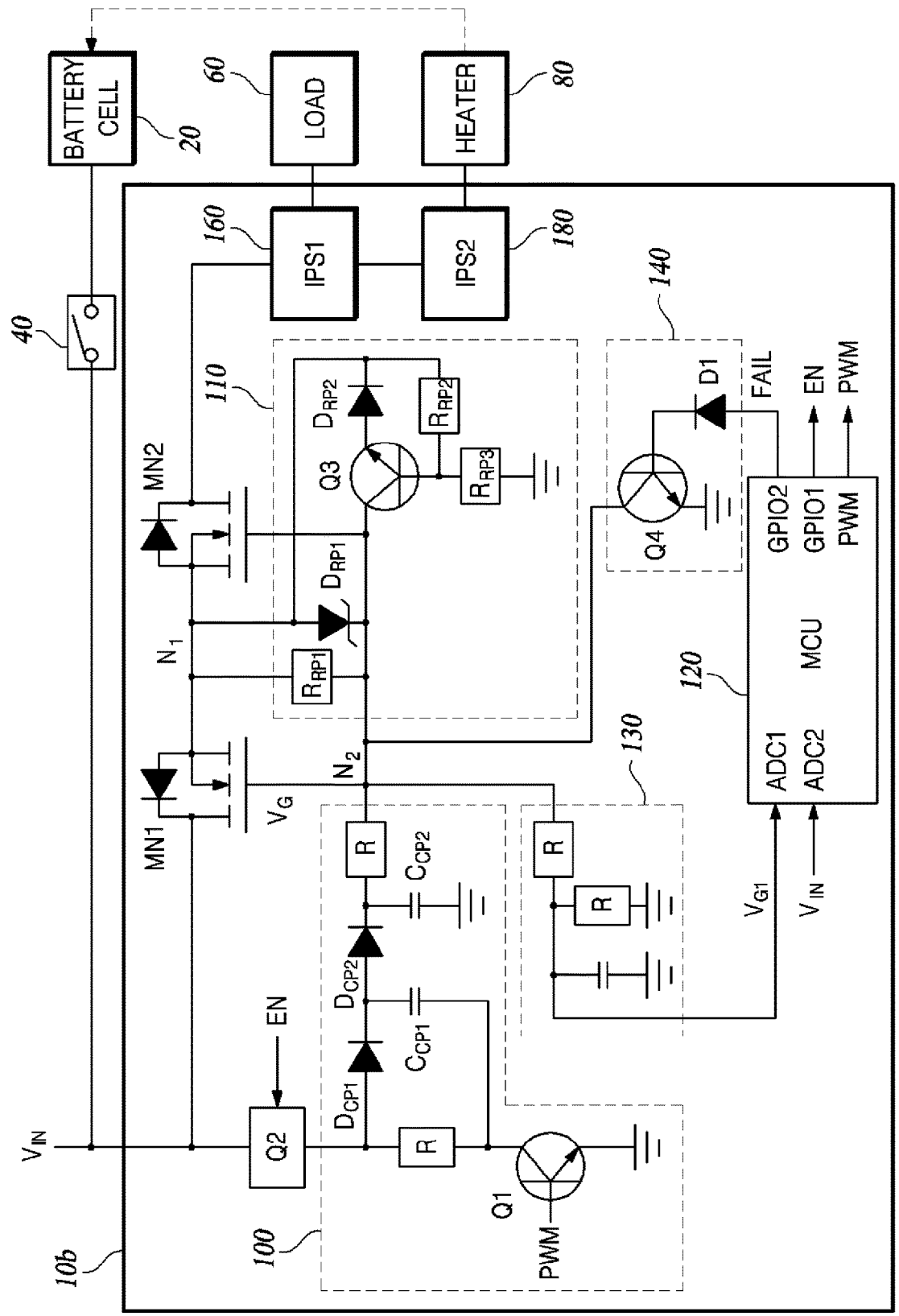
FIG. 3 is a schematic diagram illustrating a configuration of a power control circuit of a vehicle according to another embodiment of the present disclosure.

FIG. 3 is a schematic diagram illustrating a configuration of a power control circuit of a vehicle according to another embodiment of the present disclosure. When describing the vehicle power control circuit 10b shown in FIG. 3, detailed descriptions of the parts that overlap with FIG. 1 will be omitted.

The vehicle power control circuit 10b may further include a shutdown circuit 140 configured to forcefully turn off the N-type semiconductor switches MN1 and MN2 based on a fail-mode flag (FAIL) signal received from the microcontroller 120.

The microcontroller 120 may detect whether a short circuit has occurred in the internal components of the power switches 160 to 180 or the load 60 and 80 connected to the power switches 160 to 180. For this purpose, a short detection circuit may be additionally provided between the microcontroller 120 and the power switches 160 to 180. The detailed description of the circuit for detecting shorts is omitted here as it is commonly known in the field. When a short circuit is detected, the microcontroller 120 may output a FAIL signal with a first logic level. The first logic level may be a logic high level (e.g., 5V), but is not limited thereto.

The shutdown circuit 140 may include a fourth semiconductor switch Q4 and a diode D1.

The anode of the diode D1 may be electrically connected to an output port GPIO2 of the microcontroller 120 where the FAIL signal is output.

The fourth semiconductor switch Q4 has a first terminal connected to the output terminal (i.e., second node $N_2$) of the charge pump circuit, a second terminal connected to the ground terminal, and a third terminal connected to the cathode of the diode D1. The fourth semiconductor switch Q4 may be an active-high semiconductor switch. For example, the fourth semiconductor switch Q4 may be an NPN transistor. In this case, the first, second, and third terminals may be the collector, emitter, and base terminals, respectively. When the FAIL signal has a logic high level, the fourth semiconductor switch Q4 may be turned on. As a result, the voltage at the second node $N_2$, i.e., the drive voltage $V_G$, becomes 0V, causing the N-type semiconductor switches MN1 and MN2 to be forcefully turned off.

Figure 4:
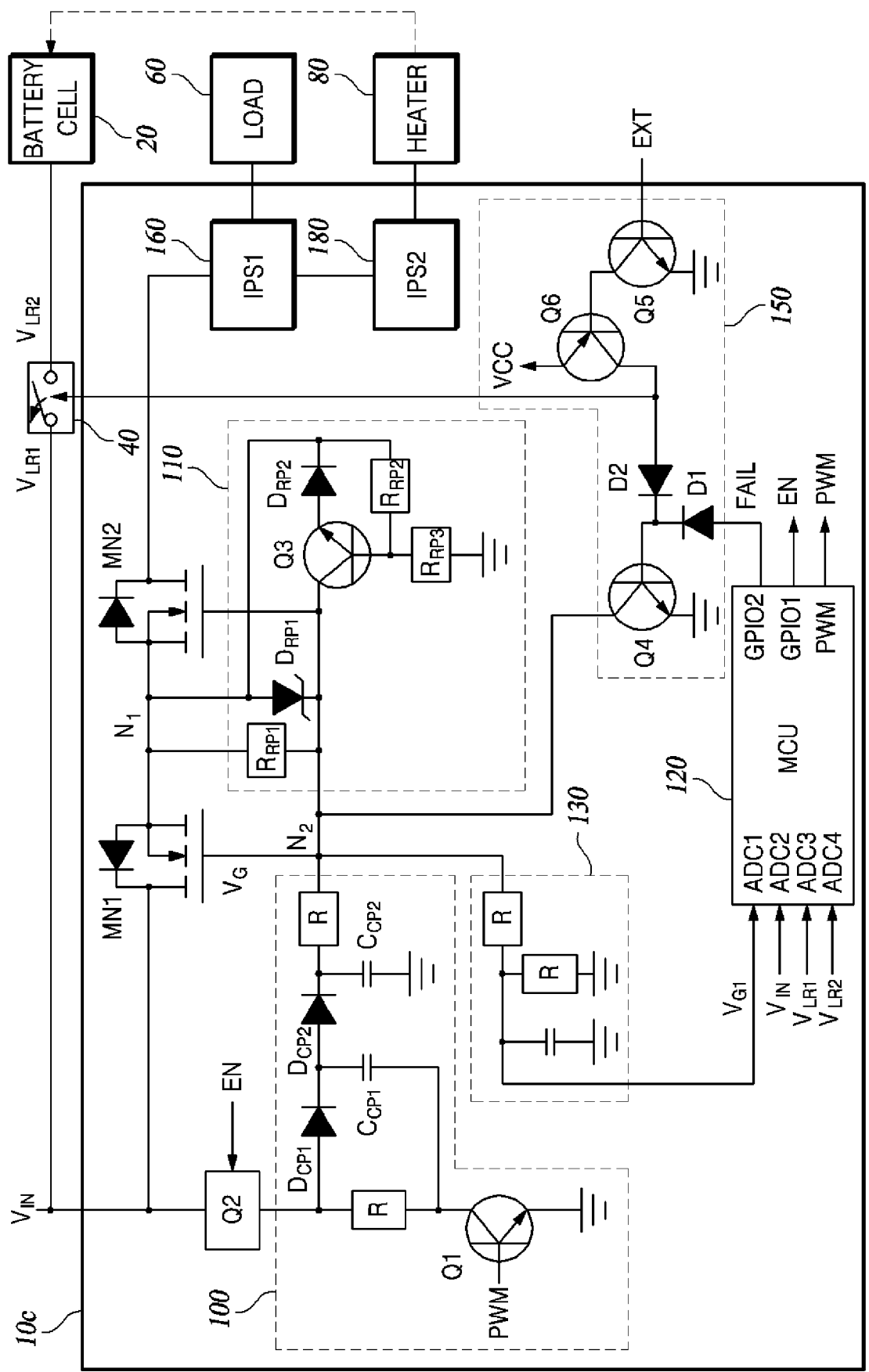
FIG. 4 is a circuit diagram illustrating a configuration of a power control circuit of a vehicle according to another embodiment of the present disclosure.

FIG. 4 is a circuit diagram illustrating a configuration of a power control circuit of a vehicle according to another embodiment of the present disclosure. When describing the vehicle power control circuit 10c shown in FIG. 4, detailed descriptions of the parts that overlap with FIG. 1 and/or FIG. 3 will be omitted.

The vehicle power control circuit 10c may further include a cutoff circuit 150 configured to forcibly turn off the N-type semiconductor switches MN1 and MN2 based on an external (EXT) signal indicating that a collision has occurred in the vehicle. The EXT signal may be a signal input from the airbag control unit (ACU) installed in the vehicle.

The cutoff circuit 150 may include one or more semiconductor switches Q4 to Q6 and one or more diodes D1 and D2.

The fifth semiconductor switch Q5 and the sixth semiconductor switch Q6 may be selectively turned on by the EXT signal. For example, the fifth semiconductor switch Q5 and the sixth semiconductor switch Q6 may be turned on for the EXT signal at a first logic level and turned off for the EXT signal at a second logic level. The first logic level may be a logic high level (e.g., 5V), and the second logic level may be a logic low level (e.g., 0V), but these are not limited thereto.

The fifth semiconductor switch Q5 may include a first terminal through which the EXT is received, a second terminal connected to the first terminal of the sixth semiconductor switch Q6, and a third terminal connected to the ground terminal. The sixth semiconductor switch Q6 may include a second terminal connected to the anode terminal of the second diode D2 and a third terminal through which a VCC voltage (e.g., 5V) is received.

The fifth semiconductor switch Q5 operates as an active-high semiconductor switch, and the sixth semiconductor switch Q6 may operate as an active-low semiconductor switch. For example, the fifth semiconductor switch Q5 may be an NPN transistor, and the sixth semiconductor switch Q6 may be a PNP transistor. In this case, the first, second, and third terminals of the fifth semiconductor switch Q5 and the sixth semiconductor switch Q6 may be the base, collector, and emitter terminals, respectively.

When the EXT signal is at a logic high level, the fifth semiconductor switch Q5 and the sixth semiconductor switch Q6 may be turned on, allowing the VCC voltage to be applied to the anode terminal of the second diode D2. As a result, the fourth semiconductor switch Q4 may be turned on in a cascading manner, causing the voltage at the second node $N_2$, i.e., the drive voltage $V_G$, to become 0V, thereby forcibly turning off the N-type semiconductor switches MN1 and MN2.

Meanwhile, in the event of a vehicle collision, the battery pack may sustain damage from the compressive load, thereby elevating the risk of battery cell explosions. To address this concern, the cutoff circuit 150 may be further configured to forcibly turn off the latch relay 40 by utilizing the EXT signal at a first logic level. For this purpose, the anode terminal of the second diode D2 may be electrically connected to the control terminal of the latch relay 40. That is, when the EXT signal at the first logic level turns on the fifth semiconductor switch Q5 and the sixth semiconductor switch Q6, the VCC voltage may be applied to the control terminal of the latch relay 40, resulting in the latch relay 40 being turned off.

The microcontroller 120 may measure the drive voltage $V_G$ and/or the voltages $V_{LR1}$ and $V_{LR2}$ at the terminals of the latch relay 40 to determine whether the N-type semiconductor switches MN1 and MN2 and/or the latch relay 40 are turned off. When the cutoff circuit 150 operates normally, the drive voltage $V_G$ becomes 0V, and the latch relay 40 opens, causing differences in the voltages across the latch relay's terminals $V_{LR1}$ and $V_{LR2}$. Therefore, the microcontroller 120 may determine that the N-type semiconductor switches MN1 and MN2 and/or the latch relay 40 are turned off when the drive voltage $V_G$ is equal to or less than a predetermined second threshold and the voltage difference between $V_{LR1}$ and $V_{LR2}$ at the terminals of the latch relay 40 is greater than a predetermined third threshold.

The microcontroller 120 may receive the EXT signal to identify whether the N-type semiconductor switches MN1 and MN2 and/or the latch relay 40 have been turned off due to a vehicle collision. When the EXT signal has the first logic level and the drive voltage $V_G$ and/or the voltages $V_{LR1}$ and $V_{LR2}$ at the terminals of the latch relay 40 satisfy the above-described conditions, the microcontroller 120 may determine that the N-type semiconductor switches MN1 and MN2 and/or the latch relay 40 have been forcefully turned off due to the operation of the cutoff circuit 150.

Figure 5:
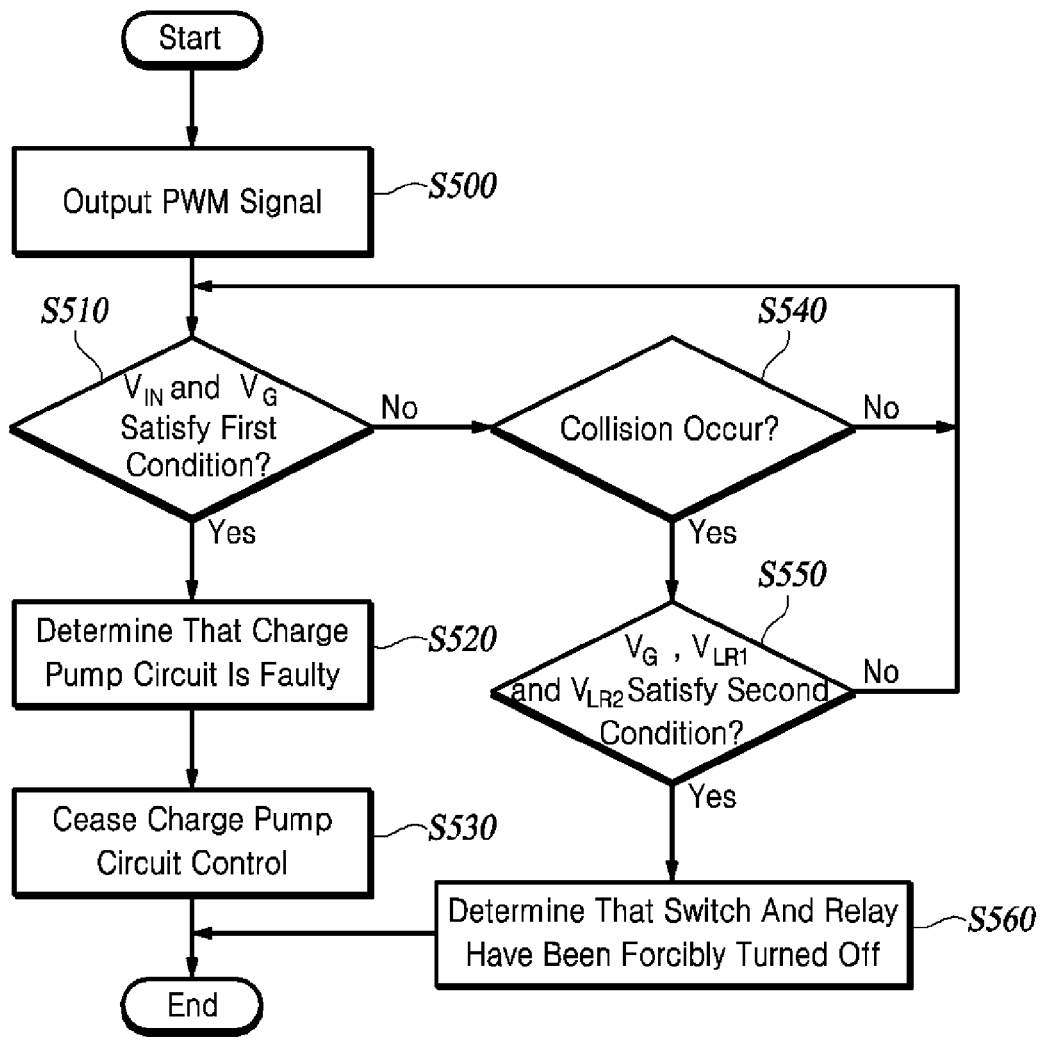
FIG. 5 is a flowchart illustrating the operation of a microcontroller according to an embodiment of the present disclosure.

FIG. 5 is a flowchart illustrating the operation of a microcontroller according to an embodiment of the present disclosure.

The microcontroller 120 may generate a PWM signal for the boost operation of the charge pump circuit 100 and output the PWM signal to the charge pump circuit 100 (S500). The microcontroller 120 may periodically or aperiodically measure the input voltage $V_{IN}$, drive voltage $V_G$, and/or the voltages $V_{LR1}$ and $V_{LR2}$ at the terminals of the latch relay 40.

The microcontroller 120 may determine whether the measured input voltage $V_{IN}$ and drive voltage $V_G$ satisfy a first condition (S510). The first condition may be, for example, that the difference between the value obtained by multiplying the input voltage $V_{IN}$ by the boost ratio of the charge pump circuit 100 and the measured drive voltage $V_G$ is equal to or greater than a predetermined first threshold TH1.

When the first condition is met, the microcontroller 120 may determine that the charge pump circuit 100 is faulty (S520), and halt the control for the operation of the charge pump circuit 100 (S530). For example, the microcontroller 120 may cease the output of the PWM signal.

When the first condition is not met, the microcontroller 120 may determine whether a collision has occurred with the vehicle (S540). For example, when a EXT signal with the first logic level is received from the airbag control unit, the microcontroller 120 may conclude that a collision has occurred with the vehicle.

When it is determined that a collision has occurred with the vehicle, the microcontroller 120 may determine whether the measured driving voltage $V_G$ and the voltages $V_{LR1}$ and $V_{LR2}$ measured at both ends of the latch relay 40 meet a second condition (S550). The second condition may be, for example, that the drive voltage $V_G$ is equal to or less than a predetermined second threshold, and the difference between the voltages $V_{LR1}$ and $V_{LR2}$ measured at both ends of the latch relay 40 is equal to or greater than a predetermined third threshold.

When the second condition is met, the microcontroller 120 may determine that the N-type semiconductor switches MN1 and MN2 and/or the latch relay 40 have been forcefully turned off due to the operation of the cutoff circuit 150 (S560).

An embodiment of this disclosure is advantageous in terms of reducing costs by utilizing N-type transistors connected back-to-back and replacing a separate gate driver IC with a charge pump circuit.

An embodiment of this disclosure is advantageous in terms of achievement of stable operation by turning off the N-type transistors connected back-to-back in the case of reverse voltage application.

An embodiment of this disclosure is advantageous in terms of protection of the battery cell by turning off the latch relay connected between the power control circuit and the battery cell in the event of a collision of the vehicle. As a result, the stability and quality of the vehicle can be expected to improve.

The advantages of this disclosure are not limited to the aforesaid, and other advantages not described herein may be clearly understood by those skilled in the art from the descriptions below.

Each component of the device or method according to the present disclosure may be implemented as hardware or software, or a combination of both hardware and software. Furthermore, the functions of each component may be implemented in software, and the microprocessor may be programmed to execute the corresponding software functions for each component.

Various embodiments of the systems and techniques described in this specification may be implemented using digital electronic circuits, integrated circuits, field programmable gate arrays (FPGAs), application-specific integrated circuits (ASICs), computer hardware, firmware, software, and/or combinations thereof. These various embodiments may also include one or more computer programs executable on a programmable system. A programmable system includes a storage system, at least one input device, and at least one output device, and a programmable processor (which may be a specialized or general-purpose processor) interconnected to receive and transmit data and commands from/to the input and output devices. Computer programs (also known as programs, software, software applications, or code) consist of instructions for a programmable processor and are stored on a "computer-readable recording medium."

A computer-readable recording medium includes all types of storage devices that store data capable of being read by a computer system. These computer-readable recording media may include non-volatile or non-transitory media such as read-only memory (ROM), compact disc ROM (CD-ROM), magnetic tapes, floppy disks, memory cards, hard disks, magneto-optical disks, storage devices, as well as transient media like data transmission media. Furthermore, computer-readable recording media may be distributed across computer systems connected by a network, allowing computer-readable code to be stored and executed in a distributed manner.

The flowcharts/timing diagrams presented in this specification depict the sequential execution of each process, but this is solely intended to offer an illustrative description of the technical concept inherent in a possible embodiment of the present disclosure. In other words, a person with ordinary skill in the art to which the embodiment of the present disclosure belongs would understand that, within the context of the embodiment described in this disclosure, alterations and adaptations can be made to the sequence specified in the flowcharts/timing diagrams, such as changing the order of execution or parallelizing certain processes, as long as they remain within the fundamental scope of the embodiment's features. Consequently, it should be noted that the flowcharts/timing diagrams are not strictly confined to a linear chronological order.

The above description is merely illustrative of the technical concept of the embodiment and, within the field of technology to which this embodiment belongs, those skilled in the art would recognize that various modifications and variations are possible within the essential scope of the embodiment's characteristics. Therefore, the disclosed embodiments are not intended to limit but to describe the technical idea of the embodiments, and the scope of the technical idea of the embodiments is not limited by the embodiments. The scope of protection for the embodiments should be understood in accordance with the claims provided below, and all technical concepts that are within an equivalent scope should be interpreted as being encompassed within the rights of the embodiments.

What is claimed is:

1. A power control circuit for a vehicle, the power control circuit comprising:
    at least one power switch;
    N-type semiconductor switches electrically connected between a power supply terminal to which an input voltage is applied and the at least one power switch, wherein the N-type semiconductor switches are connected back-to-back;
    a charge pump circuit configured to generate a drive voltage for driving the N-type semiconductor switches by boosting the input voltage;
    a microcontroller configured to generate a pulse width modulation (PWM) signal for the operation of the charge pump circuit; and
    a voltage attenuation circuit configured to attenuate the drive voltage and apply the attenuated drive voltage to the microcontroller.

2. The power control circuit of claim 1, wherein the charge pump circuit comprises:
    a plurality of diodes connected in series;
    a plurality of capacitors connected to cathode terminals of the plurality of diodes, respectively; and
    at least one first semiconductor switch connected between a ground terminal and one terminal of at least one of the plurality of capacitors, respectively, wherein the at least one first semiconductor switch is configured to selectively turned on based on the PWM signal.

3. The power control circuit of claim 1, further comprising a second semiconductor switch electrically connected between the power supply terminal and the charge pump circuit, wherein:
    the second semiconductor switch is selectively turned on based on a signal from the microcontroller; and
    the charge pump circuit is supplied with the input voltage based on the second semiconductor switch being turned on.

4. The power control circuit of claim 1, further comprising:
    a reverse voltage protection circuit electrically connected between an output terminal of the charge pump circuit and a node in which the N-type semiconductor switches are connected to each other.

5. The power control circuit of claim 4, wherein the reverse voltage protection circuit comprises:
    a first resistor connected between the node and the output terminal;
    a first diode connected in parallel with the first resistor;

a third semiconductor switch having a first terminal connected to the output terminal;

a second resistor connected between a second terminal of the third semiconductor switch and the node;

a third resistor connected between the second terminal of the third semiconductor and a ground terminal; and a second diode connected between a third terminal of the third semiconductor switch and the node.

6. The power control circuit of claim 5, wherein the third semiconductor switch is turned on, based a reverse voltage being applied between the power supply terminal and the ground terminal, to form a voltage higher by a threshold voltage of the second diode than a ground voltage at the output terminal of the charge pump circuit.

7. The power control circuit of claim 1, wherein the at least one power switch comprises:

a first power switch configured to selectively supply the input voltage to a load; and a second power switch configured to selectively supply the input power to a heater adjusting temperature of a battery cell.

8. The power control circuit of claim 1, wherein the microcontroller further configured to:

measure the drive voltage; and determine whether the charge pump circuit is faulty based on the measured drive voltage.

9. The power control circuit of claim 8, wherein the microcontroller further configured to:

measure the input voltage; and determine that the charge pump circuit is faulty based on difference between the measured drive voltage and a value obtained by multiplying the measured input voltage by a boost ratio of the charge pump circuit being equal to or greater than a predetermined first threshold.

10. The power control circuit of claim 8, wherein the microcontroller stops generating the PWM signal based on the charge pump circuit being determined to be faulty.

11. The power control circuit of claim 1, further comprising a cutoff circuit configured to forcibly turn off the N-type semiconductor switches based on a fail-mode flag signal from the microcontroller.

12. The power control circuit of claim 11, wherein the cutoff circuit comprises:

a diode having an anode terminal connected to an output port through which the microcontroller outputs the fail-mode flag signal; and a fourth semiconductor switch having a first terminal connected to the output terminal of the charge pump circuit, a second terminal connected to a ground terminal, and a third terminal connected to the anode terminal of the diode, wherein the fourth semiconductor switch is turned on based on the fail-mode signal having a first logic level.

13. The power control circuit of claim 12, wherein the microcontroller further configured to output the fail-mode signal having the first logic level based on a short circuit being detected in an internal component of the at least one switch or in a load connected to the at least one power switch.

14. The power control circuit of claim 1, further comprising a cutoff circuit configured to forcibly turn off the N-type semiconductor switches based on a collision flag signal indicating occurrence of a collision with the vehicle.

15. The power control circuit of claim 14, wherein the cutoff circuit comprises:

a fifth switch and a sixth switch that are selectively turned on based on the collision flag signal;

a diode having an anode terminal connected to one terminal of the sixth semiconductor switch; and a fourth semiconductor switch having a first terminal connected to the output terminal of the charge pump circuit, a second terminal connected to a ground terminal, and a third terminal connected to a cathode terminal of the diode.

16. The power control circuit of claim 15, wherein:

the anode terminal of the diode is electrically connected to a control terminal of a latch relay which selectively connects the power supply terminal and a battery cell based on a signal applied to the control terminal; and the cutoff circuit is configured to forcibly turn off the latch relay based on the collision flag signal having a first logic level being applied.

17. The power control circuit of claim 16, wherein the microcontroller further configured to:

measure the drive voltage and voltages at both ends of the latch relay; and determine whether the N-type semiconductor switches and the latch relay are turned off based on the measured drive voltage and the measured voltages at both ends of the latch relay.

18. The power control circuit of claim 17, wherein the microcontroller determines that the N-type semiconductor switches and the latch relay are turned off based on the measured drive voltage being equal to or less than a predetermined second threshold and based on a difference between the measured voltages at both ends of the latch relay being equal to or greater than a predetermined third threshold.

19. A vehicle comprising the power control circuit of claim 1.

20. A method of operating a power control circuit including at least one power switch, N-type semiconductor switches electrically connected between a power supply terminal to which an input voltage is applied and the at least one power switch, wherein the N-type semiconductor switches being connected back-to-back, and a charge pump circuit configured to generate a drive voltage for driving the N-type semiconductor switches by boosting the input voltage, the method comprising:

generating, by a microcontroller, a pulse width modulation (PWM) signal for the operation of the charge pump circuit;

measuring, by the microcontroller, the input voltage and the drive voltage; and determining, by the microcontroller, whether the charge pump circuit is faulty based on the measured input voltage and the measured drive voltage satisfying a predetermined first condition.

* * * * *